(12) United States Patent
Hirohata et al.

(10) Patent No.: US 6,315,124 B1
(45) Date of Patent: *Nov. 13, 2001

(54) CONTAINER FOR TRANSPORTING PRECISION SUBSTRATES

(75) Inventors: Tatsuaki Hirohata, Fukushima-ken; Takashi Betsuyaku, Tokyo, both of (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/684,562

(22) Filed: Oct. 5, 2000

Related U.S. Application Data

(63) Continuation of application No. 09/287,712, filed on Apr. 7, 1999, now Pat. No. 6,220,438.

(30) Foreign Application Priority Data

Apr. 13, 1998 (JP) .................................................. 10-117859

(51) Int. Cl.[7] .................................................. B65D 85/48

(52) U.S. Cl. ........................................... 206/454; 206/711

(58) Field of Search ..................................... 206/454, 455, 206/710–712, 722–723; 118/500

(56) References Cited

U.S. PATENT DOCUMENTS

| 5,228,568 | 7/1993 | Ogino et al. . |
| 5,749,467 | 5/1998 | Gregerson . |
| 5,803,269 | 9/1998 | Jacoby et al. . |
| 5,873,468 | 2/1999 | Ejima et al. . |

Primary Examiner—Luan K. Bui
(74) Attorney, Agent, or Firm—Hogan & Hartson, L.L.P.

(57) ABSTRACT

There is disclosed a container for transporting precision substrates comprising a container body having an upper open periphery, a cassette accommodated in the container body for holding a plurality of the precision substrates in parallel, a top covering which is fitted to the open periphery of the container body via a gasket, and a substrate presser attached inside the top covering, wherein the container body has a skirt flange extending from a flange portion provided around the open periphery to the vicinity of a locking means for locking the top covering, and the flange portion is provided with a through hole or slit, or wherein the container body has the skirt flange, partition ribs are provided perpendicularly to the skirt flange in a space between the skirt flange and side wall of the container body, and each portion of the flange portion corresponding to each space partitioned by the partition ribs is provided with a through hole or slit. There is provided a high-quality transportation container suitable for automatic cleaning and reuse, which improves productivity by shortening a cleaning time and a drying time,.and is provided at a low cost since it eliminates any need of special mechanism in cleaning and drying equipment or metallic molds to reduce cost of equipment.

2 Claims, 5 Drawing Sheets

CONTAINER FOR TRANSPORTING PRECISION SUBSTRATES

CROSS REFERENCE OF RELATED APPLICATION

This is a continuation of application Ser. No. 09/287,712, filed Apr. 7, 1999 and issued as U.S. Pat. No. 6,220,438 on Apr. 24, 2001.

BACKGROUND OF THE INVENTION

Field of the Invention

The present invention relates to a container for transporting precision substrates, which is for accommodating in its inside precision substrates such as semiconductor wafers (also referred to wafers hereinafter), magnetic disks or the like, and useful for protecting the substrates from damages and contamination, as well as reliable storage and transportation of the substrates.

Description of the Related Art

Conventional containers for transporting precision substrates consist of, as shown in FIG. 7, a container body 2 having an upper open periphery, a cassette 4 to be accommodated in the container body 2 for holding a plurality of precision substrates W in parallel, a top covering 3 mountable on the container body 2 which is fitted to the open periphery 9 of the container body via a gasket 5, and a substrate presser (retainer or cushion member) 6 attached inside the top covering 3.

Further, a pair of hooks 7 extending downward are provided around an open periphery of the top covering 3 and a pair of locking members (clamping member) 8 are provided around the open periphery of the container body 2 for locking the hooks 7. The transportation container 1 can be closed by putting the top covering 3 on the container body 2, and locking the hooks 7 with the locking members 8 so as to bring the top covering 3 into close contact with the container body 2 via the gasket 5.

A skirt flange 10 is further provided around the open periphery 9 of the container body in order to reinforce the open periphery 9 and to protect the locking members 8 by absorbing an externally applied force. The skirt flange 10 is useful also as a grip when the transportation container 1 is handled by hand.

In recent years, degree of cleanliness required for precision substrates such as semiconductor wafers has been becoming higher and higher, as semiconductor circuits become increasingly finer. Therefore, high quality has been required with regard also to cleanliness of the transportation container. Upon use of a transportation container, the container is thoroughly cleaned by hand with a cleaning solution such as those containing surfactant and rinse such as pure water and super-pure water to remove contamination source such as particles from the surface of the container before use. Further, although such a transportation container has frequently been thrown away after use heretofore, it has become to be reused in view of cost reduction, resource saving, and environmental problems, as the container becomes larger with the use of larger diameter substrates or increased number of substrates to be accommodated therein.

Moreover, in recent years, because the transportation container has become to be cleaned and dried under a more highly clean environment for improving the cleanliness and stabilization thereof, treatment process steps such as cleaning, drying and transporting by a series of automatic apparatuses has been increased.

As mentioned above, the cleaning process has become increasingly important in order to keep the quality of transportation containers of precision substrates upon their use. While the cleaning has conventionally been conducted by hand in many cases, it invited a problem that the quality of cleaning could not be constant as larger transportation containers have become used. In particular, reusable containers are likely to be adhered with many particles, and contamination degree thereof may be fluctuated. Therefore, automatic cleaning apparatuses have become to be used for cleaning of reusable transportation containers in order to stabilize the quality of cleaning. However, another problem was arisen that when cleaned transportation containers are dried automatically, the containers should be placed so that their open periphery should face downward, and during this process a lot of water remains between the skirt flange and the side wall of the containers. Accordingly, it took a long period of time to dry them, and hence the productivity was degraded. Further, when water remained at the flange portion, this portion could not be cleaned sufficiently, and therefore particles and the like became likely to remain, which may be a cause of contamination of substrates to be accommodated. In order to solve these problems by the design of the apparatuses, a new processing unit suitable for the shape of the transportation containers, for example, an apparatus for inverting the container body, should be provided. This restricts applicability of the apparatuses, and invites increase of equipment cost and thus cleaning cost.

In order to provide a hole or slit on the side of the flange portion to prevent the retention of water, it is necessary to provide a special sliding mechanism in metallic molds for molding the transportation containers, because the hole or slit may interfere with the release of molded containers from the metallic molds. This might increase the cost of the metallic molds.

SUMMARY OF THE INVENTION

The present invention has been accomplished to solve the above-mentioned problems in the prior art, and its major objects are to provide a high-quality transportation container suitable for automatic cleaning and reuse, to improve productivity by shortening a drying time after cleaning, and to provide such a transportation container at a low cost by eliminating any need of special mechanism in cleaning and drying equipment or metallic molds to reduce cost of equipment.

To achieve the objects mentioned above, the present invention provides a container for transporting precision substrates comprising a container body having an upper open periphery, a cassette accommodated in the container body for holding a plurality of the precision substrates in parallel, a top covering mountable on the container body which is fitted to the open periphery of the container body via a gasket, and a substrate presser attached inside the top covering, wherein the container body has a skirt flange extending from a flange portion provided around the open periphery to the vicinity of a locking means for locking the top covering, and the flange portion is provided with a through hole or slit.

According to the structure of the transportation container mentioned above, for instance, when the container body is set on an automatic cleaning apparatus so that the open periphery should face downward, and the container is cleaned with cleaning solution or rinse water sprayed from cleaning nozzles toward upper and lower center portions of the container, the cleaning solution or rinse water remained in the space between the skirt flange and the side wall of the container (also referred to as a "skirt flange space" hereinafter) can be easily and rapidly drained through the through hole or slit provided at the flange portion without inverting the container by 180 degrees. Therefore, it is not necessary to provide any particular equipment for inverting the container, and hence the productivity can be improved and the cost can be reduced. Moreover, because the cleaning solution containing particles or the like after the cleaning process does not stay in the skirt flange space, the particles and the like substantially do not adhere to the container again, and therefore cleaning efficiency is improved. In addition, it can be dried in a short period of time in the drying process because there remains no water. The drying time can further be shortened, and the productivity can be improved by employing a ventilation drying process, since a hot air flows through the through hole or slit.

The present invention also provides a container for transporting precision substrates comprising a container body having an upper open periphery, a cassette accommodated in the container body for holding a plurality of the precision substrates in parallel, a top covering mountable on the container body which is fitted to the open periphery of the container body via a gasket, and a substrate presser attached inside the top covering, wherein the container body has a skirt flange extending from a flange portion provided around the open periphery to the vicinity of a locking means for locking the top covering, partition ribs are provided perpendicularly to the skirt flange in a space between the skirt flange and the side wall of the container body, and each portion of the flange portion corresponding to each space partitioned by the partition ribs is provided with a through hole or slit.

According to the structure of the transportation container mentioned above, for instance, when the container body is set on an automatic cleaning apparatus so that the open periphery should face downward, and the container is cleaned with cleaning solution or rinse water sprayed from cleaning nozzles toward upper and lower center portions of the container, the cleaning solution or rinse water remained in each space between the skirt flange and the side wall of the-container and partitioned by the partition ribs (also referred to as a "partition rib space" hereinafter) can be easily and rapidly drained through the through hole or slit provided at each portion of the flange portion corresponding to each space partitioned by the partition ribs without inverting the container by 180 degrees. Therefore, it is not necessary to provide any particular equipment for inverting the container, and hence the productivity can be improved and the cost can be reduced. Moreover, because the cleaning solution containing particles or the like after the cleaning process does not stay in the partition rib space, the particles and the like substantially do not adhere to the container again, and therefore cleaning efficiency is improved. In addition, it can be dried in a short period of time in the drying process because there remains no water. The drying time can further be shortened, and the productivity can be improved by employing a ventilation drying process, since a hot air flows through the through hole or slit.

In the aforementioned container, a plurality of through holes or slits may be provided.

When a plurality of the through holes or slits are provided, drainage rate can be enhanced substantially in proportion to the number of the holes or slits provided, and the drying rate can also be enhanced. This leads to improvement of productivity and reduction of the cost. The number of the holes or slits is preferably limited within a range where the mechanical strength of the flange portion is not significantly reduced.

In the aforementioned container, the through holes or slits are preferably provided at a shoulder of the flange portion.

By providing the through holes or slits at a shoulder of the flange portion, which corresponds to a corner between the open periphery and the skirt flange, the cleaning solution or rinse water can be drained from two sides forming the corner. Therefore, the drainage efficiency can further be improved, and draining is also improved.

Further, in the aforementioned container, the through hole or slit is provided at a position of one of the partition ribs so that the both spaces partitioned by the partition rib should be connected by the through hole or slit.

According to this structure, the through hole or slit can be provided substantially without degrading the strength of the flange portion or partitioning rib. In addition, drainage efficiency and drying efficiency are further improved, since fluid can flow from both of the spaces partitioned by the partitioning rib.

Further, in the aforementioned containers, the through hole or slit preferably has such a shape that its cross section should become larger from the space between the skirt flange and the side wall of the container body toward the outside.

By this structure, resistance to water flowing through the through hole or slit is decreased, therefore water can be removed easily, and drainage efficiency is further improved.

According to the present invention, there can be provided a high-quality transportation container for accommodation, storage and transportation of precision substrates, which would require a further higher degree of cleanliness in future. The container is sufficiently suitable for automatic cleaning apparatuses, improves productivity by markedly shortening cleaning time and drying time, and also improves cleaning efficiency, thereby substantially eliminating the particle contamination. In addition, since the transportation container of the present invention does not require to provide any equipment, for example, equipment for inverting the container, in particular, in automatic cleaning apparatuses, the cost of equipment can be saved. The cost for producing metallic molds can also be saved, since the position of the through hole allows release from the metallic molds for molding the container body without any special mold release structure of the molds.

DESCRIPTION OF THE INVENTION AND EMBODIMENTS

The present invention and embodiments thereof will be explained hereinafter with reference to the appended drawings, but the scope of the present invention is not limited to them.

The inventors of the present invention conducted researches mainly on improvement of shape of the container body in order to solve the problem, among various problems concerning reuse of containers for transporting precision substrates, that conventional containers have an area where water is likely to remain when it is cleaned with cleaning solution or rinse water, and to develop a transportation container which obviates large investments such as for providing an apparatus for inverting the container for drainage especially when an automatic cleaning apparatus is used, and is capable of being drained easily and rapidly. As a result, the inventors of the present invention found that the problem could be solved by providing through holes or slits on the flange portion of the skirt flange, and accomplished the present invention by investigating in detail requirements of location, shape, number or the like of the holes or slits.

Figure 1:
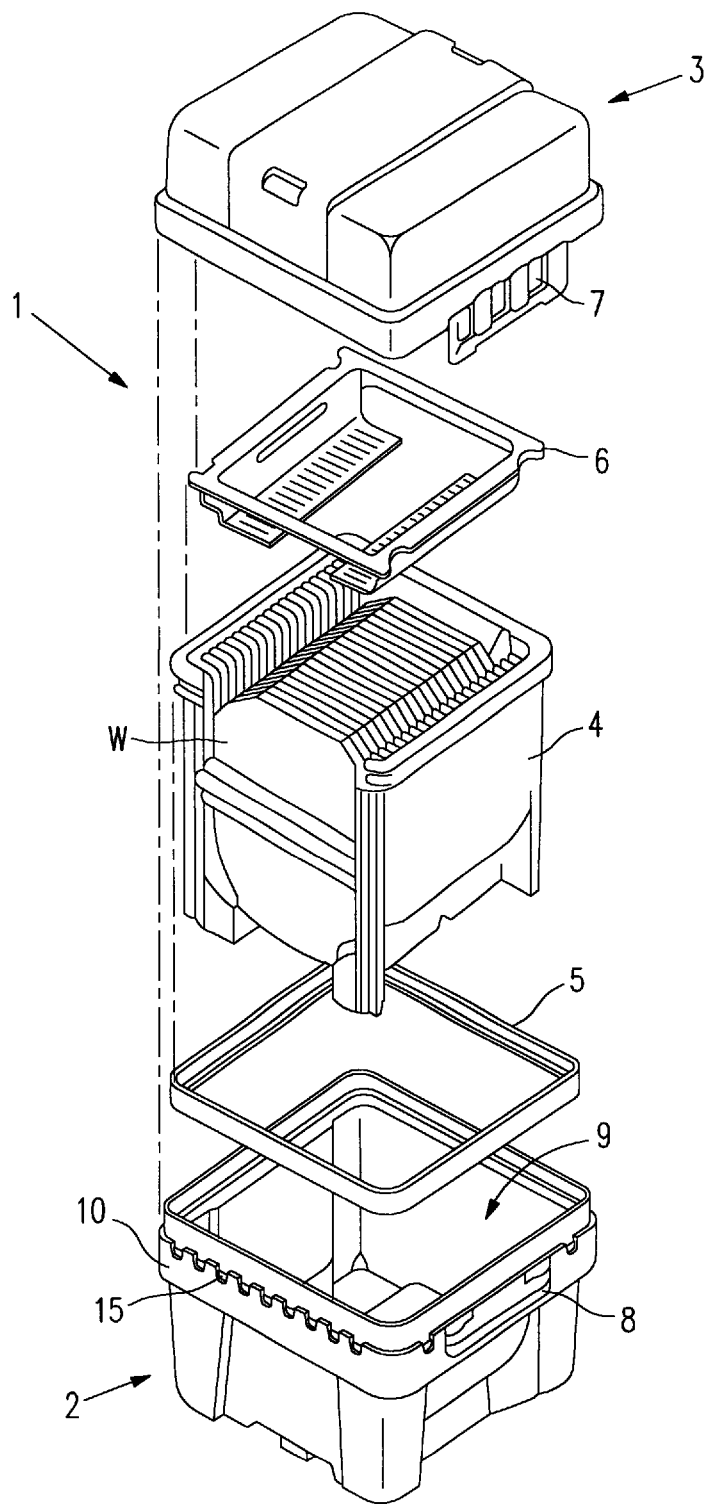
FIG. 1 is an exploded perspective view of an exemplary container for transporting precision substrates according to the present invention.

A container for transporting precision substrates according to the present invention consists of, for example, as shown in the exploded perspective view of FIG. 1, a container body 2 having an upper open periphery 9 and provided with a skirt flange 10 around the open periphery 9 and through holes or slits 15, a top covering 3 for sealably closing the open periphery 9 of the container body 2, a gasket 5 placed on the whole open periphery 9 for sealing between the container body 2 and the top covering 3, hooks 7 provided at least two places on the top covering 3, and locking members 8 provided on the side wall of the container body 2 for closing the open periphery 9 of the container body 2 with the top covering 3, a cassette 4 for holding precision substrates W in parallel, and a substrate presser 6 provided on the back face of the top covering 3 for protecting the precision substrates W during transportation.

Figure 2:
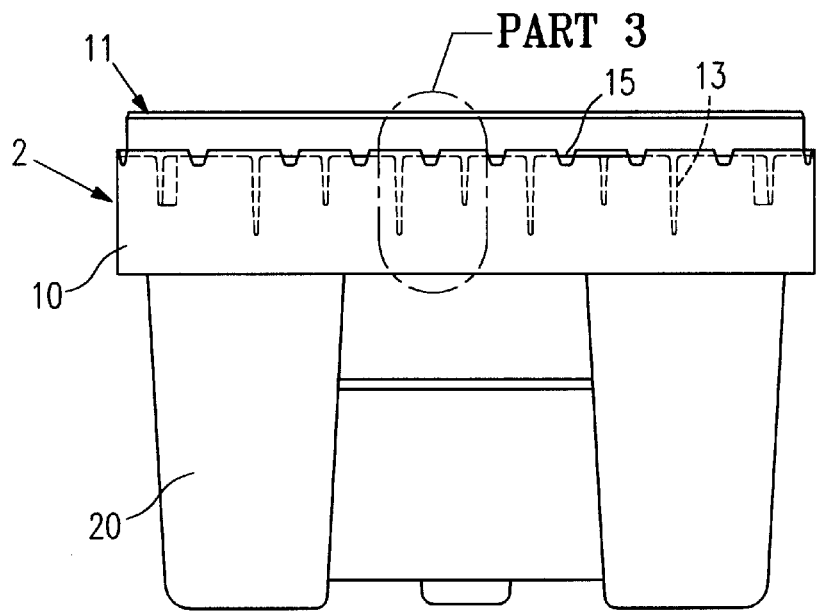
FIG. 2 is a side view of an exemplary container body for transporting precision substrates according to the present invention.
Figure 3B:
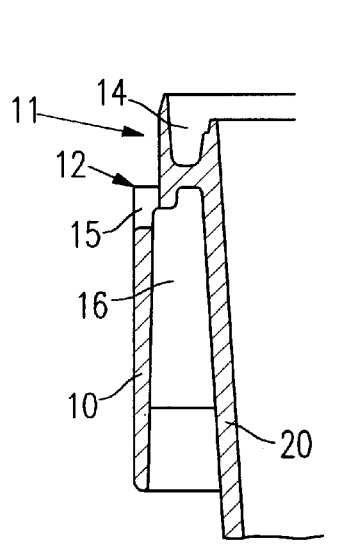
FIG. 3 is a detailed drawing of part 3 of FIG. 2 showing an example of through hole of the present invention. (a) Front view, (b) cross sectional view along line 3(b)—3(b).
Figure 3A:
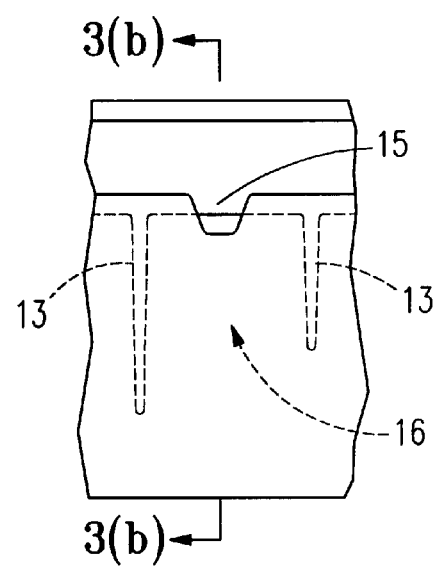

FIG. 2 is a side view of an exemplary container body according to the present invention, which shows the side having no locking member to be engaged with the hook of the top covering. FIG. 3 is a detailed drawing of the part 3 in FIG. 2 showing an example of the through hole of the present invention, where (a) is a front view, and (b) is a cross sectional view along the line 3(b)—3(b).

The container body 2 is provided, on the outer periphery of a flange portion 11 provided around the open periphery 9 except for the portions corresponding to the locking members 8 for the engagement with the top covering 3, with a skirt flange 10 extending downward from the flange portion to the vicinity of the locking members, approximately in parallel to the side wall 20 of the container. Further, partition ribs 13 of two kinds of lengths are provided alternately at a constant interval between the skirt flange 10 and the side wall 20 of the container in order to prevent deformation of the skirt flange and stabilize the size. Therefore, the space between the flange 10 and the side wall 20 of the container is divided into a plurality of partition rib spaces 16 (compartments) by the partition ribs 13. A gasket receiving part 14 is integrally molded on the flange portion 11.

The through holes or slits 15, which are the main characteristics of the present invention, are provided at a flange shoulder portion 12 between two adjacent partition ribs 13 in a number identical to that of the partition rib spaces 16.

Figure 4:
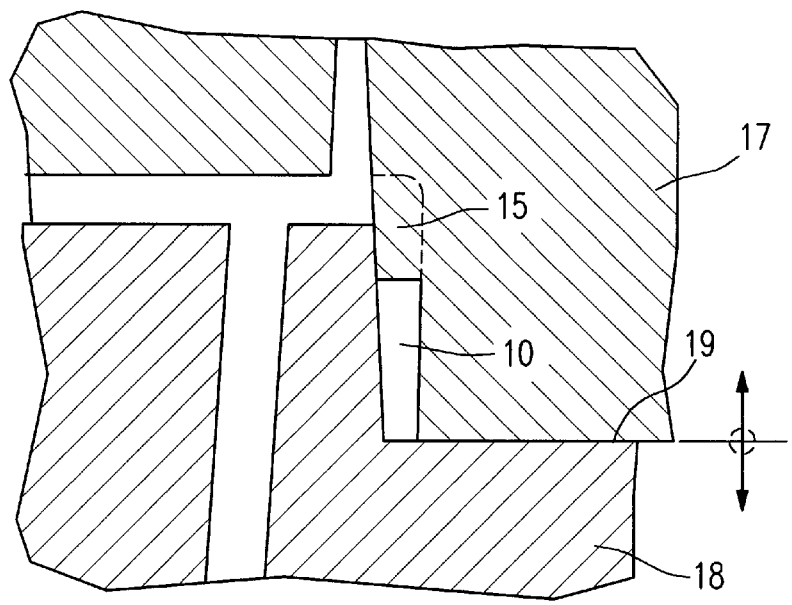
FIG. 4 is a partial cross sectional view of a metallic mold for molding a through hole of the present invention.

FIG. 4 is a partial cross sectional view of metallic molds for molding the skirt flange 10 and the through holes or slits 15 of the container body 2. As shown in this figure, the through hole 15 is provided at such a position that it should not interfere with release of a molded product when a fixed metallic mold 17 and a movable metallic mold 18 are opened at a parting line 19, i.e., a separating line of the metallic molds, and the product is released. Therefore, it is not necessary to provide any special mechanism for sliding projections for forming the holes to prevent the projections from interfering with the release of product, and the product can be taken out according to an ordinary mold opening process.

Figure 5B:
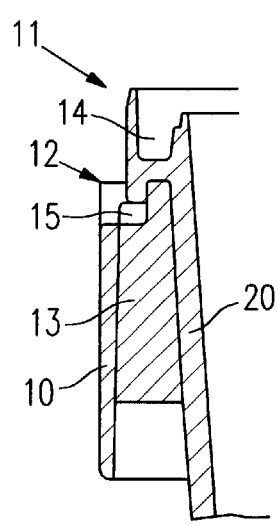
FIG. 5 is a detailed drawing showing another example of through hole of the present invention. (a) Front view, (b) cross sectional view along line 5(b)—5(b).
Figure 5A:
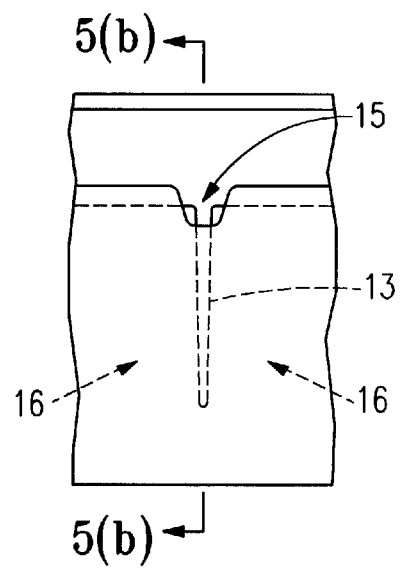

FIG. 5 is a detailed drawing showing another example of the through hole of the present invention, where (a) is a front view and (b) is a cross sectional view along the line 5(b)—5(b).

In this example, the through hole or slit 15 is provided at a position where both of the center of partition rib 13 and the center of through hole 15 are positioned and which is on the flange shoulder 12. In addition, the through hole is provided at a position adjacent to the flange shoulder in the partition rib 13. By employing this structure, the both spaces 16 partitioned by the partition rib 13 are connected by the through hole or slit 15, and hence drainage efficiency and drying efficiency can be improved.

Figure 6A:
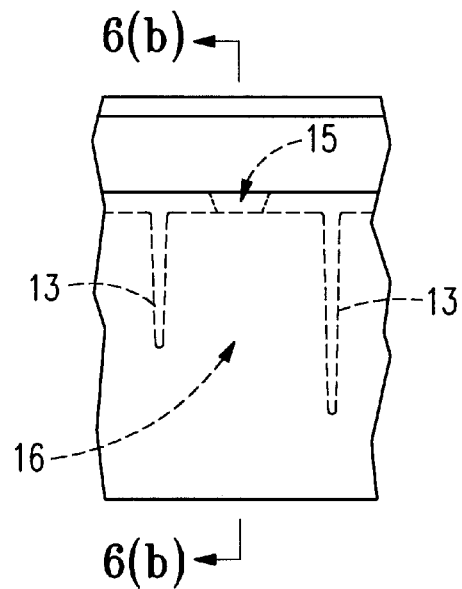
FIG. 6 is a detailed drawing showing another example of through hole of the present invention. (a) Front view, (b) cross sectional view along line 6(b)—6(b).
Figure 6B:
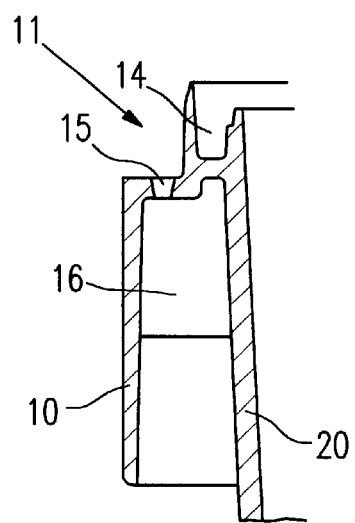
Figure 7:
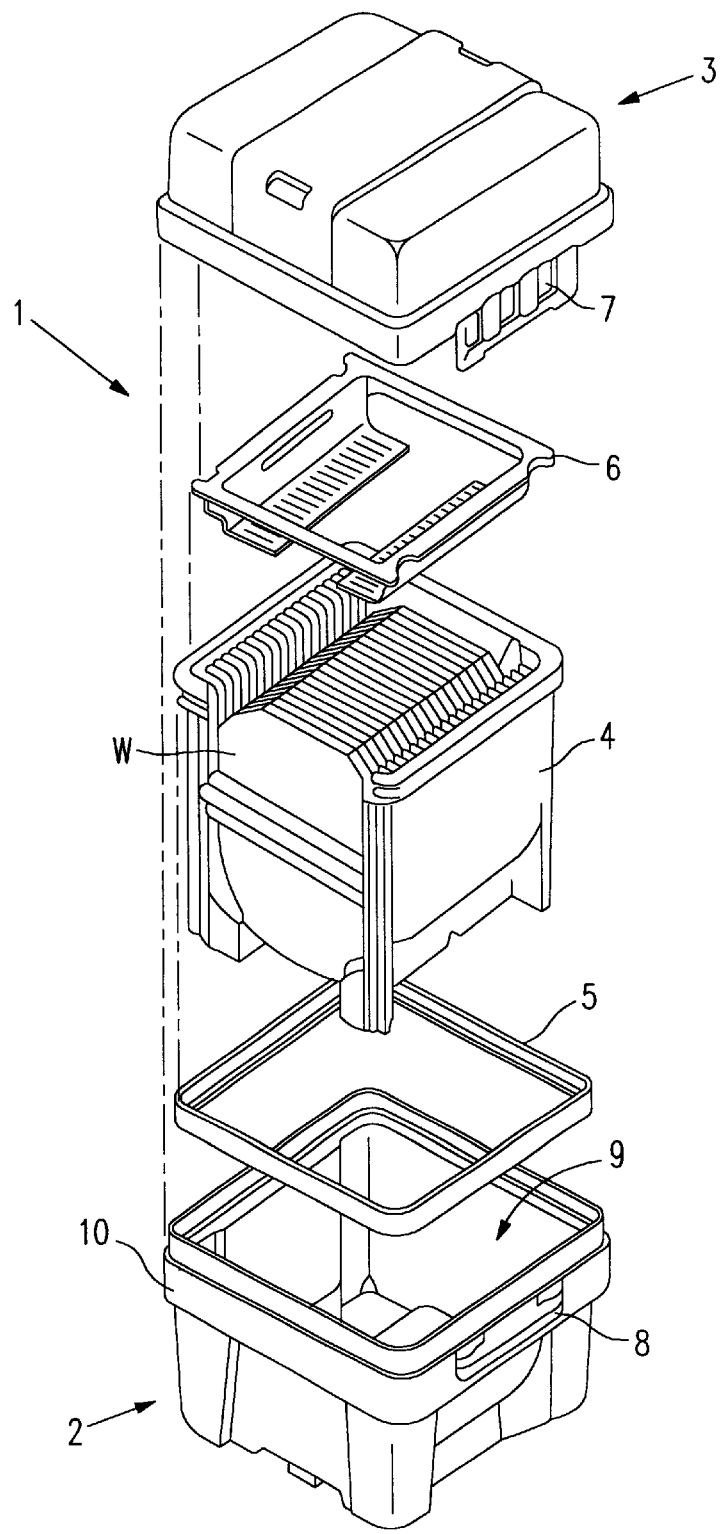
FIG. 7 is an exploded perspective view of a conventional container for transporting precision substrates.

FIG. 6 is a detailed drawing showing another example of the through hole of the present invention, where (a) is a front view and (b) is a cross sectional view along the line 6(b)—6(b).

In this example, the flange portion 11 of the container body 2 has a slightly larger width compared with that of the previous examples (see FIGS. 3 and 5), and the through hole or slit 15 is provided substantially in parallel to the skirt flange 10 in the flange portion 11. The through hole had a elliptic shape, and the wall of the through hole was tapered so that the cross section of the through hole should become larger from the partition rib space 16 toward the outside. This improves draining, and further improves the drainage efficiency.

The shape of the through hole or the slit is not particularly limited. It may be circular, elliptic, trapezoid or the like. As for the size, the through holes shown in the above-mentioned FIGS. 2, 3 and 5 had a trapezoid shape having an upper width of 9 mm, lower width of 4.5 mm, and height of 6 mm. In this case, the water remained in the partition rib space could be drained within about five seconds. As for the size of the through hole less than 5 mm in terms of the diameter of round hole is undesirable since a hole in such a size takes too much time to drain remained cleaning solution. On the other hand, when it is more than 10 mm, the mechanical strength of the flange is significantly reduced though draining of cleaning solution may be improved. Accordingly, a size within 5–10 mm in terms of the diameter of round hole is preferred.

It is preferable that the shape of the slit as well as the through hole can be made as larger in length to be drained within about less than 5 seconds.

EXAMPLES

Specific embodiments of the present invention will be explained hereinafter with reference to the following working examples, but the present invention is not limited to them.

EXAMPLE 1

Holes for preventing cleaning solution retention were provided at a flange shoulder portion of a container body of container for transporting semiconductor wafers having a diameter of 200 mm, and the effect thereof was examined.

The container body of this transportation container had a size of about 280 mm in length×280 mm in width×180 mm in height. Partition ribs were provided on the whole periphery of the flange portion at an interval of 25 mm, except for the portions corresponding to locking members to be engaged with a top covering, to form 20 compartments in total.

Through holes in a total number of 20 were provided on the portions of the flange shoulder corresponding to the partitioned compartments at their center. The hole preferably has such a shape that its cross section should become larger from the partition rib space toward the outside for enhancing the drainage rate and for providing draft angle required for the release from metallic molds. In this example, therefore, through holes in a trapezoid shape having a size of 9 mm in width at the flange shoulder, 4.5 mm in width of the bottom of trapezoid, and 6 mm in height were provided. By providing these through holes, water retained in the partition rib spaces could be drained within about five seconds.

Then, the drying time was examined. When the container was dried in a box-type ventilation drier with ventilation of dust-free air at 80° C., it was dried within about three minutes.

Moreover, particle contamination reduction effect was examined. In the experiment, the container body was contaminated by leaving it under a usual environment, not a high cleanliness environment, and contamination of the flange portion was visually examined. Then, the container body was cleaned with a cleaning solution, and the contamination of the flange portion was visually examined again. As a result, as shown in Table 1, no dust contamination was observed in all of ten samples.

EXAMPLE 2

Drainage test was conducted using a container body of the same shape and size as those of the container body of Example 1 except that the through holes were round holes having a diameter of 3 mm, and provided on the flange shoulder. As a result, draining was completed-within about 12 seconds.

Comparative Example

By using a container body having the same shape and size as those of Examples except that no through hole was provided, the drying test and investigation of the particle contamination reduction effect were conducted under the same condition as those of Examples.

In the drying test, it took about six minutes to completely dry the container body.

As for the particle contamination reduction effect, residual contamination was visually observed in 5 samples out of 10 samples, as also shown in Table 1.

TABLE 1

| Example No. | Sample | Before cleaning | | After cleaning | |
|---|---|---|---|---|---|
| | | Contaminated | No contamination | Contaminated | No contamination |
| Example 1 | With through holes | 10 samples | 0 | 0 | 10 samples |

TABLE 1-continued

| Example No. | Sample | Before cleaning | | After cleaning | |
|---|---|---|---|---|---|
| | | Contaminated | No contamination | Contaminated | No contamination |
| Comparative Example | No through hole | 10 samples | 0 | 5 samples | 5 samples |

From the results mentioned above, it can be understood that by providing through holes in the flange portion, quick draining and quick drying could be realized without allowing water retention. Further, it was confirmed as for the size of through holes that more practical drainage rate can be obtained with a size of 5 mm or more in terms of diameter of round holes. When drying is conducted with ventilation, the drying time is remarkably shortened because the skirt flange space and the external space are connected through the through holes.

In addition, by providing the through holes, a strong cleaning effect for particle contamination can be obtained, and a cleaning solution or pure water sufficiently circulates between the skirt flange space and the external space through the through holes. Therefore, cleaning efficiency can be markedly improved even in such a narrow space as the flange space.

The present invention is not limited to the embodiments described above. The above-described embodiments are mere examples, and those having the substantially same structure as that described in the appended claims and providing the similar functions and advantages are included in the scope of the present invention.

For example, while transportation containers for accommodating semiconductor wafers having a diameter of 200 mm (8 inches) and through holes provided therein were explained in the embodiments of the present invention, the present invention can also be used for recently used larger diameters such as 250 mm (10 inches) to 400 mm (16 inches) or more.

Further, the precision substrates to be accommodated in the container are not limited to the semiconductor wafers. The present invention is also useful for transporting such precision substrates as magnetic disks, and quartz substrates.

What is claimed is:

1. A container for transporting precision substrates comprising a container body having an upper open periphery, a cassette accommodated in the container body for holding a plurality of the precision substrates in parallel, a top covering mountable on the container body which is fitted to the open periphery of the container body via a gasket, and a substrate presser attached inside the top covering, wherein the container body has a skirt flange extending from a flange portion provided around the open periphery to the vicinity of a locking means for locking the top covering, and the flange portion is provided with a through hole or slit which has such a shape that its cross section should become larger from the space between the skirt flange and the side wall of the container body toward the outside, and the through hole or slit is provided in parallel with the skirt flange.

2. The container for transporting precision substrates according to claim 1, wherein a plurality of through holes or slits are provided.

* * * * *

UNITED STATES PATENT AND TRADEMARK OFFICE
CERTIFICATE OF CORRECTION

PATENT NO. : 6,315,124 B1
DATED : November 13, 2001
INVENTOR(S) : Hirohata et al.

It is certified that error appears in the above-identified patent and that said Letters Patent is hereby corrected as shown below:

<u>Title page,</u>
Item [73], add -- Shin-Etsu Polymer, Co., Ltd., Tokyo (JP) --.

Signed and Sealed this

Seventeenth Day of September, 2002

Attest:

JAMES E. ROGAN
Director of the United States Patent and Trademark Office

Attesting Officer